US008473265B2

(12) United States Patent
Hlasny et al.

(10) Patent No.: US 8,473,265 B2
(45) Date of Patent: Jun. 25, 2013

(54) METHOD FOR DESIGNING RAISED FLOOR AND DROPPED CEILING IN COMPUTING FACILITIES

(75) Inventors: Christopher Hlasny, Boston, MA (US); James W. VanGilder, Pepperell, MA (US); Henrik Daae, Slelde (DK); Kresten Peter Vester, Kolding (DK)

(73) Assignee: Schneider Electric IT Corporation, West Kingston, RI (US)

( * ) Notice: Subject to any disclaimer, the term of this patent is extended or adjusted under 35 U.S.C. 154(b) by 1015 days.

(21) Appl. No.: 12/259,214

(22) Filed: Oct. 27, 2008

(65) Prior Publication Data
US 2010/0106464 A1 Apr. 29, 2010

(51) Int. Cl.
*G06G 7/48* (2006.01)

(52) U.S. Cl.
USPC .......................................................... 703/6

(58) Field of Classification Search
USPC ................................................ 703/6–7, 1
See application file for complete search history.

(56) References Cited

U.S. PATENT DOCUMENTS

| | | | |
|---|---|---|---|
| 5,682,949 A | 11/1997 | Ratcliffe et al. | |
| 5,850,539 A | 12/1998 | Cook et al. | |
| 5,995,729 A | 11/1999 | Hirosawa et al. | |
| 6,134,511 A | 10/2000 | Subbarao | |
| 6,374,627 B1 | 4/2002 | Schumacher et al. | |
| 6,574,104 B2 | 6/2003 | Patel et al. | |
| 6,714,977 B1 | 3/2004 | Fowler et al. | |
| 6,718,277 B2 | 4/2004 | Sharma | |
| 6,721,672 B2 | 4/2004 | Spitaels et al. | |
| 6,745,579 B2 | 6/2004 | Spinazzola et al. | |
| 6,859,366 B2 | 2/2005 | Fink | |
| 6,862,179 B2 | 3/2005 | Beitelmal et al. | |
| 6,967,283 B2 | 11/2005 | Rasmussen et al. | |
| 7,020,586 B2 | 3/2006 | Snevely | |
| 7,031,870 B2 | 4/2006 | Sharma et al. | |
| 7,051,946 B2 | 5/2006 | Bash et al. | |
| 7,313,503 B2 | 12/2007 | Nakagawa et al. | |
| 7,472,043 B1 | 12/2008 | Low et al. | |
| 7,726,144 B2 * | 6/2010 | Larson et al. | 62/259.2 |
| 7,881,910 B2 * | 2/2011 | Rasmussen et al. | 703/1 |
| 7,885,795 B2 * | 2/2011 | Rasmussen et al. | 703/5 |

(Continued)

FOREIGN PATENT DOCUMENTS

WO    2006119248 A2    11/2006

OTHER PUBLICATIONS

VanGilder et al. "Airflow Uniformity thourhg Perforated Tiles in a Raised-Floor Data Center" White Paper 121 Jul. 17-22, 2005. 10 Pages.*

(Continued)

*Primary Examiner* — Eunhee Kim
(74) *Attorney, Agent, or Firm* — Lando & Anastasi, LLP

(57) ABSTRACT

A system and method for design aspects of a cooling system for a data center is provided. In one example, a method is provided including acts of receiving an indication to position a perforated tile in a model, calculating cooling available in a model space adjacent to the tile, and displaying an indication of cooling availability within the context of the model on a computer system. In another example, a method is provided for manipulating representations of data elements in a model of a data center. The method allows a user to move multiple representations by adjusting the position of a layer of the model space relative to another layer in the model space.

23 Claims, 12 Drawing Sheets

U.S. PATENT DOCUMENTS

| | | |
|---|---|---|
| 2001/0042616 A1 | 11/2001 | Baer |
| 2002/0059804 A1 | 5/2002 | Spinazzola et al. |
| 2003/0115024 A1 | 6/2003 | Snevely |
| 2003/0158718 A1 | 8/2003 | Nakagawa et al. |
| 2004/0240514 A1 | 12/2004 | Bash et al. |
| 2005/0023363 A1 | 2/2005 | Sharma et al. |
| 2005/0225936 A1 | 10/2005 | Day |
| 2005/0267639 A1 | 12/2005 | Sharma et al. |
| 2006/0112286 A1 | 5/2006 | Whalley et al. |
| 2006/0139877 A1 | 6/2006 | Germagian et al. |
| 2007/0038414 A1 | 2/2007 | Rasmussen et al. |
| 2007/0078635 A1 | 4/2007 | Rasmussen et al. |
| 2007/0174024 A1* | 7/2007 | Rasmussen et al. .............. 703/1 |
| 2007/0213000 A1 | 9/2007 | Day |
| 2008/0174954 A1 | 7/2008 | VanGilder et al. |
| 2009/0138313 A1 | 5/2009 | Morgan et al. |
| 2009/0150123 A1 | 6/2009 | Archibald et al. |
| 2009/0223234 A1* | 9/2009 | Campbell et al. ................ 62/127 |
| 2009/0326879 A1* | 12/2009 | Hamann et al. ................... 703/6 |

OTHER PUBLICATIONS

Innovative Research, Inc., http://web.archive.org/web/20050405003224/http://www.inres.com/, Apr. 5, 2005, published on World Wide Web, printed Feb. 17, 2011.

International Search Report and Written Opinion from International Application No. PCT/US2008/063675, dated Feb. 6, 2009.

International Search Report from International Application No. PCT/US2006/16739, dated Oct. 3, 2006.

International Search Report and Written Opinion from International Application No. PCT/US2009/062113, dated Jun. 17, 2010.

Karki, K. et al., "Techniques for controlling airflow distribution in raised-floor data centers," Advances in Electronic Packaging 2003: Presented at 2003 International Electronic Packaging Technical Conference and Exhibition, Jul. 6-11, 2003, Maui, Hawaii, Interpack '03; Ipack '03; vol. 2, XP009134432; pp. 621-628.

ASHRAE, "Thermal Guidelines for Data Processing Environments", American Society of Heating, Refrigerating, and Air-Conditioning Engineers, Inc., 2004, Atlanta.

Bash, C.E., Patel, C.D., and Sharma, R.K., "Efficient Thermal Management of Data Centers—Immediate and Long-Term Research Needs" Intl., J. Heat, Ventilating, Air-Conditioning and Refrigeration Research, 2003, pp. 137-152, vol. 9, No. 2.

Dunlap, K., "Cooling Audit for Identifying Potential Cooling Problems in Data Centers", White Paper #40, pp. 1-18, American Power Conversion, May 20, 2004, published on World Wide Web.

Herrlin, M.K., "Rack Cooling Effectiveness in Data Centers and Telecom Central Offices: The Rack Cooling Index (RCI)," ASHRAE Transaction, 2005, pp. 725-731, vol. 111(2).

Innovative Research, Inc., http://web.archive.org/web/20051221005029/http://www.inres.com/, Dec. 21, 2005, published on World Wide Web.

"Management Strategy for Network Critical Physical Infrastructure", White Paper #100, pp. 110, American Power Conversion, Dec. 15, 2003, published on World Wide Web.

Rasmussen, N., "Cooling Strategies for Ultra-High Density Racks and Blade Servers", White Paper #46, pp. 1-22, American Power Conversion, Mar. 29, 2005, published on World Wide Web.

Rasmussen, N., "Strategies for Deploying Blade Servers in Existing Data Centers", White Paper #125, pp. 1-14, American Power Conversion, Mar. 29, 2005, published on World Wide Web.

Rasmussen, N., "Calculating Total Cooling Requirements for Data Centers", White Paper #25, pp. 1-8, American Power Conversion, May 20, 2005, published on World Wide Web.

Sharma, R.K., Bash, C.E., and Patel, C.D., "Dimensionless Parameters for Evaluation of Thermal Design and Performance of Large-Scale Data Centers," 8th ASME/AIAA Joint Thermophysics and Heat Transfer Conference, Jun. 24-26, 2002, St. Louis, Missouri.

"Case Study, Application of TileFlow to Improve Cooling in a Data Center," Innovative Research, Inc., 2004.

Search Report from corresponding Chinese Application No. 200980152681.0 dated Nov. 26, 2012.

Karki et al., "Techniques for controlling airflow distribution in raised-floor data centers," ASME 2003, 8 pages.

Marwah, M.; Sharma, R.; Shih, R.; Patel, C.; Bhatia, V.; Mekanapurath, M.; Velumani, R.; Velayudhan, S., 2009, Data analysis, visualization and knowledge discovery in sustainable data centers, In Proceedings of the 2nd Bangalore Annual Compute Conference (COMPUTE '09), 8 pages.

VanGilder et al., "Airflow Uniformity through Perforated Tiles in a Raised-Floor Data Center", White Paper 121, Jul. 17-22, 2005, 10 pages.

VanGilder, James W. et al., "Caputure index: an airflow-based rack cooling performance metric," 2007, ASHRAE Transactions, vol. 113, pp. 126-136.

VanGilder, James W. et al., "Real-Time prediction of rack-cooling performance," 2006, ASHRAE Transactions, vol. 112, pp. 151-162.

* cited by examiner

METHOD FOR DESIGNING RAISED FLOOR AND DROPPED CEILING IN COMPUTING FACILITIES

BACKGROUND

1. Field of the Invention

At least one embodiment in accord with the present invention relates generally to systems and methods for data center management, and more specifically, to systems and methods for managing data center cooling.

2. Discussion of Related Art

In response to the increasing demands of information-based economies, information technology networks continue to proliferate across the globe. One manifestation of this growth is the centralized network data center. A centralized network data center typically consists of various information technology equipment, collocated in a structure that provides network connectivity, electrical power and cooling capacity. Often the equipment is housed of specialized enclosures termed "racks" which integrate these connectivity, power and cooling elements. In some data center configurations, these rows are organized into hot and cold aisles to decrease the cost associated with cooling the information technology equipment. These characteristics make data centers a cost effective way to deliver the computing power required by many software applications.

Various processes and software applications, such as the InfrastruXure® Central product available from American Power Conversion Corporation of West Kingston, R.I., have been developed to aid data center personnel in designing and maintaining efficient and effective of data centers configurations. These tools often guide data center personnel through activities such as designing the data center structure, positioning equipment within the data center prior to installation and repositioning equipment after construction and installation are complete. Thus, conventional tool sets provide data center personnel with a standardized and predictable design methodology.

SUMMARY OF THE INVENTION

Aspects in accord with the present invention manifest an appreciation that data center personnel would benefit from more flexibility in modeling data center layouts than is available using conventional technology. For example, data center personal may wish to model the performance of one or more groups of data center equipment within one or more data center rows. Furthermore, data center personnel may wish to model changes to the data center that depart from routine movement of equipment, such as changes to the underlying floor or ceiling structure. In addition, data center personnel may desire rapid feedback regarding the performance of their design decisions. Thus at least one embodiment in accord with the present invention provides for a system and method that enables data center personnel to model various performance characteristics associated with groups of data center equipment residing within a specified data center structure.

According to one aspect of the invention a method for presenting a cooling model of a data center, the model including representations of at least one cooling provider, at least one cooling consumer and at least one perforated tile, the at least one cooling consumer having cooling requirements is provided. The method is comprises segmenting the model into a plurality of layers, the plurality of layers having a first layer that includes the at least one perforated tile and a second layer that includes the at least one cooling consumer, receiving an indication to reposition the first layer relative to the second layer, determining, in response to the indication, at least one new position for the at least one perforated tile relative to the at least one cooling consumer, determining a cooling metric measuring the ability of the at least one cooling provider to meet the cooling requirements of the at least one cooling consumer via the at least one perforated tile in the at least one new position, and displaying the model on a computer system, the at least one cooling consumer including an indication of the cooling metric.

According to one embodiment of the present invention receiving an indication includes receiving the indication responsive to a user dragging and dropping the first layer relative to the second layer. According to another embodiment of the invention, determining the at least one new position includes determining at least one new position where a percentage of the surface area of the at least one perforated tile is occluded. According to another embodiment of the invention, determining the cooling metric includes determining a rate of airflow, and the method further comprises calculating a rate of airflow associated with the at least one perforated tile in the at least one new position as a function of the occluded percentage of the surface area of the at least one perforated tile in the at least one new position. According to another embodiment of the invention, calculating the rate of airflow includes calculating the rate of airflow as a function of the occluded percentage, the occluded percentage being valued in 25% increments.

According to one embodiment of the present invention, determining the cooling metric includes retrieving a user defined rate of airflow associated with the at least one perforated tile. According to another embodiment of the invention, determining the cooling metric includes determining a uniform rate of airflow. According to another embodiment of the invention, determining the uniform rate of airflow includes calculating the uniform rate of airflow associated with the at least one perforated tile as a function of an airflow rate of the cooling provider, a rate of leakage of airflow and a number of perforated tiles supplied by the cooling provider, the number of perforated tiles including the at least one perforated tile. According to another embodiment of the invention, displaying the model on the computer system includes displaying a representation of a rack, the representation indicating a rate of airflow in a model space adjacent to the rack. According to another embodiment of the invention, displaying the model on the computer system includes displaying the at least one new position including an indication of the cooling metric. According to another embodiment of the invention, the method further comprises repositioning the at least one perforated tile to the at least one new position.

According to one aspect of the present invention, a system for presenting a cooling model of a data center is provided. The system comprises an interface, and a controller configured to segment the model into a plurality of layers, the plurality of layers including a first layer having at least one perforated tile, and a second layer having at least one cooling consumer, receive an indication to reposition the first layer relative to the second layer, determine, in response to the indication, at least one new position for the at least one perforated tile relative to the at least one cooling consumer, determine a cooling metric measuring the ability of the at least one cooling provider to meet the cooling requirements of the at least one cooling consumer via the at least one perforated tile in the at least one new position, and display the model on a computer system, the at least one cooling consumer including an indication of the cooling metric. According to one embodiment of the present invention, the controller is further configured to receive the indication responsive to a user dragging and dropping the first layer relative to the second layer. According to another embodiment of the invention, the controller is further configured to determine the cooling metric at least in part by retrieving a user defined rate of airflow associated with the at least one perforated tile. According to another embodiment of the invention, the controller is further configured to determine the cooling metric at least in part by determining a uniform rate of airflow.

According to one embodiment of the present invention, the controller is further configured to determine the uniform rate of airflow at least in part by calculating the uniform rate of airflow associated with the at least one perforated tile as a function of an airflow rate of the cooling provider, a rate of leakage of airflow and a number of perforated tiles supplied by the cooling provider, the number of perforated tiles including the at least one perforated tile. According to another embodiment of the invention, the controller is further configured to display the model on the computer system at least in part by displaying a representation of a rack, the representation indicating a rate of airflow in a model space adjacent to the rack. According to another embodiment of the invention, the controller is further configured to display the model on the computer system at least in part by displaying the at least one new position including an indication of the cooling metric. According to another embodiment of the invention, the controller is further configured to reposition the at least one perforated tile to the at least one new position.

According to one aspect of the present invention, a computer readable medium having stored thereon sequences of instruction including instructions that will cause a processor to receive an indication to position at least one perforated tile in a cooling model of a data center, the model including representations of at least one cooling provider, at least one cooling consumer and at least one perforated tile, the at least one cooling consumer having cooling requirements, calculate cool air available in a model space adjacent to the at least one perforated tile, the act of calculating the cool air including calculating an airflow to the model space adjacent to the at least one perforated tile as a function of an airflow rate of the cooling provider, a rate of leakage of airflow and a number of perforated tiles supplied by the cooling provider, and display the model on a computer system, the model having a plurality of layers, the plurality of layers having a first layer that includes the at least one perforated tile and a second layer that includes the at least one cooling consumer and an indication of the available cool air. According to one embodiment of the present invention, the instructions will further cause a processor to receive the indication responsive to a user dragging and dropping the first layer relative to the second layer. According to another embodiment of the invention, the instructions will further cause a processor to retrieve a user defined rate of airflow associated with at least one other perforated tile. According to another embodiment of the invention, the instructions will further cause a processor to display an indication of cool air available in a model space adjacent the at least one other perforated tile using the user defined rate of airflow.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
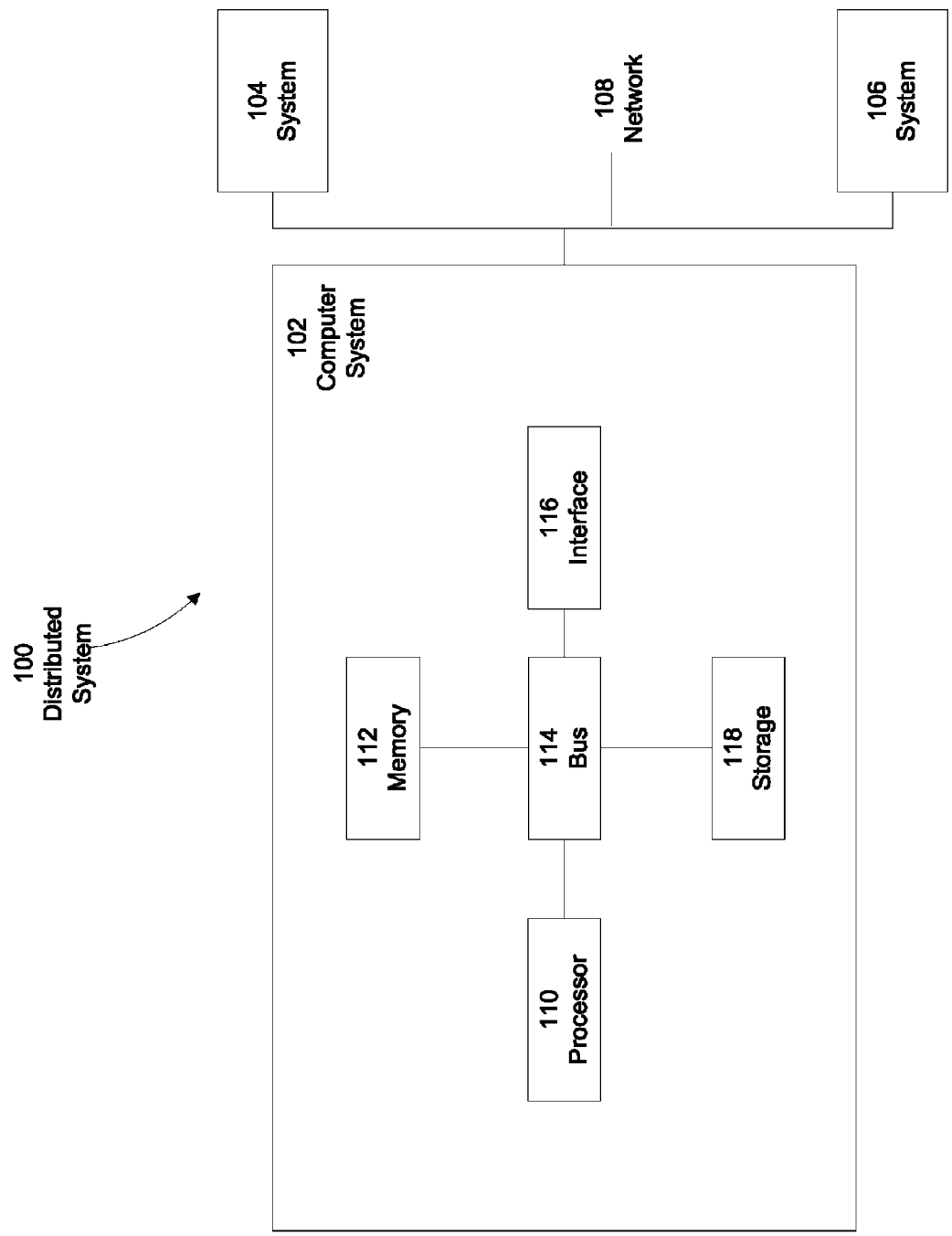
FIG. 1 shows an example computer system with which various aspects in accord with the present invention may be implemented.

At least some embodiments in accord with the present invention relate to systems and processes through which a user may design data center configurations. These systems may facilitate this design activity by allowing the user to create models of data center configurations from which performance metrics may be determined. Both the systems and the user may employ these performance metrics to determine alternative data center configurations that meet various design objectives.

In some embodiments, models may include structural components of a data center, such as, among other structural components, walls, ceilings, floors and the spaces defined by these structural components. The model may also include representations of data center equipment, such as, among other equipment, cooling consumers and cooling providers, located within the model space. Cooling providers may be any element of the data center that is involved in the generation or distribution of cool air to other data center equipment. Examples of cooling providers include, among others, computer room air conditioners (CRACs), computer room air handlers (CRAHs) and tiles located in the floor or ceiling.

Cooling consumers include any element of the data center that consumes the cooling supply generated by the cooling providers. Examples of cooling consumers include, among others, network devices, servers and other information technology equipment. In a data center, these cooling consumers may be mounted in racks, although this is not a requirement. In at least one embodiment, the model may calculate and display cooling performance information, such as cooling metrics, through representations of data center equipment.

The aspects disclosed herein, which are in accord with the present invention, are not limited in their application to the details of construction and the arrangement of components set forth in the following description or illustrated in the drawings. These aspects are capable of assuming other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

For example, according to one embodiment of the present invention, a computer system is configured to perform any of the functions described herein, including but not limited to, configuring, modeling and presenting information regarding specific data center configurations. However, such a system may also perform other functions, such as suggesting changes to data center configurations, based on, for example, industry best practices. Moreover, the systems described herein may be configured to include or exclude any of the functions discussed herein. Thus the invention is not limited to a specific function or set of functions. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Computer System

Various aspects and functions described herein in accord with the present invention may be implemented as hardware or software on one or more computer systems. There are many examples of computer systems currently in use. These examples include, among others, network appliances, personal computers, workstations, mainframes, networked clients, servers, media servers, application servers, database servers and web servers. Other examples of computer systems may include mobile computing devices, such as cellular phones and personal digital assistants, and network equipment, such as load balancers, routers and switches. Further, aspects in accord with the present invention may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Thus, the invention is not limited to executing on any particular system or group of systems. Further, aspects may be implemented in software, hardware or firmware, or any combination thereof. Thus, aspects in accord with the present invention may be implemented within methods, acts, systems, system elements and components using a variety of hardware and software configurations, and the invention is not limited to any particular distributed architecture, network, or communication protocol.

FIG. 1 shows a block diagram of a distributed computer system 100, in which various aspects and functions in accord with the present invention may be practiced. Distributed computer system 100 may include one more computer systems. For example, as illustrated, distributed computer system 100 includes computer systems 102, 104 and 106. As shown, computer systems 102, 104 and 106 are interconnected by, and may exchange data through, communication network 108. Network 108 may include any communication network through which computer systems may exchange data. To exchange data using network 108, computer systems 102, 104 and 106 and network 108 may use various methods, protocols and standards, including, among others, token ring, ethernet, wireless ethernet, Bluetooth, TCP/IP, UDP, Http, FTP, SNMP, SMS, MMS, SS7, Json, Soap, and Corba. To ensure data transfer is secure, computer systems 102, 104 and 106 may transmit data via network 108 using a variety of security measures including TSL, SSL or VPN among other security techniques. While distributed computer system 100 illustrates three networked computer systems, distributed computer system 100 may include any number of computer systems and computing devices, networked using any medium and communication protocol.

Various aspects and functions in accord with the present invention may be implemented as specialized hardware or software executing in one or more computer systems including computer system 102 shown in FIG. 1. As depicted, computer system 102 includes processor 110, memory 112, bus 114, interface 116 and storage 118. Processor 110 may perform a series of instructions that result in manipulated data. Processor 110 may be a commercially available processor such as an Intel Pentium, Motorola PowerPC, SGI MIPS, Sun UltraSPARC, or Hewlett-Packard PA-RISC processor, but may be any type of processor or controller as many other processors and controllers are available. Processor 110 is connected to other system elements, including one or more memory devices 112, by bus 114.

Memory 112 may be used for storing programs and data during operation of computer system 102. Thus, memory 112 may be a relatively high performance, volatile, random access memory such as a dynamic random access memory (DRAM) or static memory (SRAM). However, memory 112 may include any device for storing data, such as a disk drive or other non-volatile storage device. Various embodiments in accord with the present invention may organize memory 112 into particularized and, in some cases, unique structures to perform the aspects and functions disclosed herein.

Components of computer system 102 may be coupled by an interconnection element such as bus 114. Bus 114 may include one or more physical busses, for example, busses between components that are integrated within a same machine, but may include any communication coupling between system elements including specialized or standard computing bus technologies such as IDE, SCSI, PCI and InfiniBand. Thus, bus 114 enables communications, for example, data and instructions, to be exchanged between system components of computer system 102.

Computer system 102 also includes one or more interface devices 116 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow computer system 102 to exchange information and communicate with external entities, such as users and other systems.

Storage system 118 may include a computer readable and writeable nonvolatile storage medium in which instructions are stored that define a program to be executed by the processor. Storage system 118 also may include information that is recorded, on or in, the medium, and this information may be processed by the program. More specifically, the information may be stored in one or more data structures specifically configured to conserve storage space or increase data exchange performance. The instructions may be persistently stored as encoded signals, and the instructions may cause a processor to perform any of the functions described herein. The medium may, for example, be optical disk, magnetic disk or flash memory, among others. In operation, the processor or some other controller may cause data to be read from the nonvolatile recording medium into another memory, such as memory 112, that allows for faster access to the information by the processor than does the storage medium included in storage system 118. The memory may be located in storage system 118 or in memory 112, however, processor 110 may manipulate the data within the memory 112, and then copies the data to the medium associated with storage system 118 after processing is completed. A variety of components may manage data movement between the medium and integrated circuit memory element and the invention is not limited thereto. Further, the invention is not limited to a particular memory system or storage system.

Although computer system 102 is shown by way of example as one type of computer system upon which various aspects and functions in accord with the present invention may be practiced, aspects of the invention are not limited to being implemented on the computer system as shown in FIG. 1. Various aspects and functions in accord with the present invention may be practiced on one or more computers having a different architectures or components than that shown in FIG. 1. For instance, computer system 102 may include specially-programmed, special-purpose hardware, such as for example, an application-specific integrated circuit (ASIC) tailored to perform a particular operation disclosed herein. While another embodiment may perform the same function using several general-purpose computing devices running MAC OS System X with Motorola PowerPC processors and several specialized computing devices running proprietary hardware and operating systems.

Computer system 102 may be a computer system including an operating system that manages at least a portion of the hardware elements included in computer system 102. Usually, a processor or controller, such as processor 110, executes an operating system which may be, for example, a Windows-based operating system, such as, Windows NT, Windows 2000 (Windows ME), Windows XP or Windows Vista operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating systems available from various sources. Many other operating systems may be used, and embodiments are not limited to any particular implementation.

The processor and operating system together define a computer platform for which application programs in high-level programming languages may be written. These component applications may be executable, intermediate, for example, C–, bytecode or interpreted code which communicates over a communication network, for example, the Internet, using a communication protocol, for example, TCP/IP. Similarly, aspects in accord with the present invention may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions in accord with the present invention may be implemented in a non-programmed environment, for example, documents created in HTML, XML or other format that, when viewed in a window of a browser program, render aspects of a graphical-user interface or perform other functions. Further, various embodiments in accord with the present invention may be implemented as programmed or non-programmed elements, or any combination thereof. For example, a web page may be implemented using HTML while a data object called from within the web page may be written in C++. Thus, the invention is not limited to a specific programming language and any suitable programming language could also be used.

A computer system included within an embodiment may perform functions outside the scope of the invention. For instance, aspects of the system may be implemented using an existing commercial product, such as, for example, Database Management Systems such as SQL Server available from Microsoft of Seattle Wash., Oracle Database from Oracle of Redwood Shores, Calif., and MySQL from MySQL AB of Uppsala, Sweden or integration software such as Web Sphere middleware from IBM of Armonk, N.Y. However, a computer system running, for example, SQL Server may be able to support both aspects in accord with the present invention and databases for sundry applications not within the scope of the invention.

Example System Architecture

Figure 2:
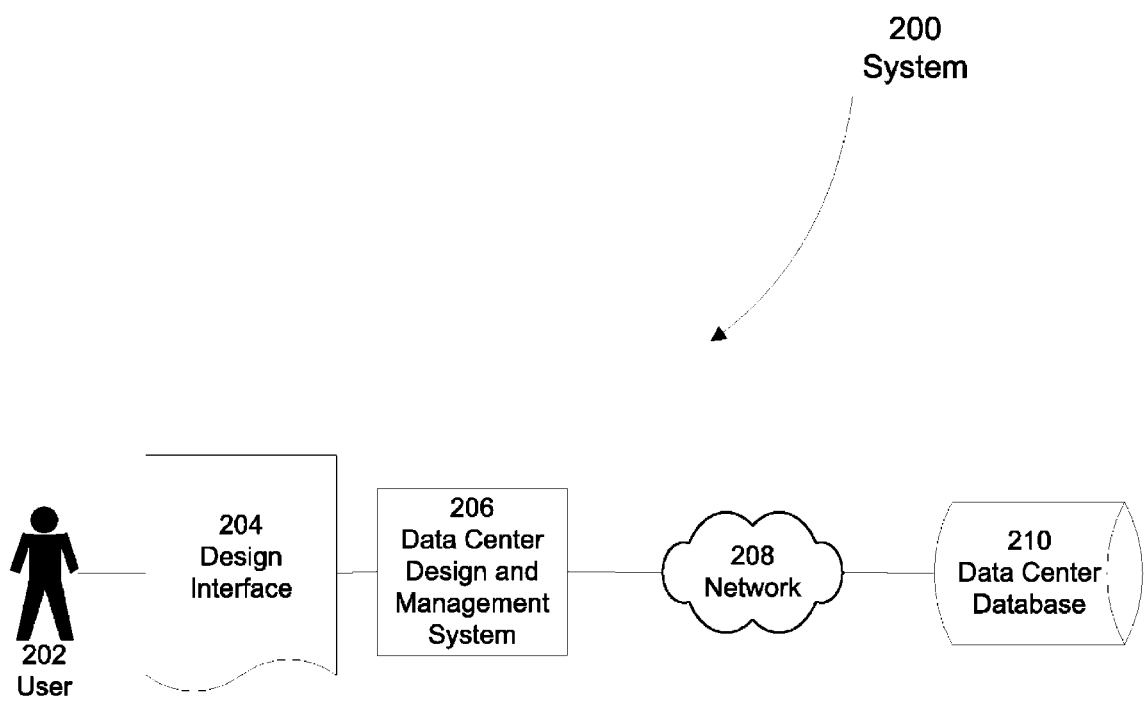
FIG. 2 illustrates an example distributed system including an embodiment.

FIG. 2 presents a context diagram including physical and logical elements of distributed system 200. As shown, distributed system 200 is specially configured in accord of the present invention. The system structure and content recited with regard to FIG. 2 is for exemplary purposes only and is not intended to limit the invention to the specific structure shown in FIG. 2. As will be apparent to one of ordinary skill in the art, many variant system structures can be architected without deviating from the scope of the present invention. The particular arrangement presented in FIG. 2 was chosen to promote clarity.

Information may flow between the elements, components and subsystems depicted in FIG. 2 using any technique. Such techniques include, for example, passing the information over the network via TCP/IP, passing the information between modules in memory and passing the information by writing to a file, database, or some other non-volatile storage device. Other techniques and protocols may be used without departing from the scope of the invention.

Referring to FIG. 2, system 200 includes user 202, design interface 204, data center design and management system 206, communications network 208 and data center database 210. System 200 may allow user 202, such as a data center architect or other data center personnel, to interact with design interface 204 to create or modify a model of one or more data center configurations. According to one embodiment, design interface 204 may include aspects of the floor editor and the rack editor as disclosed in Patent Cooperation Treaty Application No. PCT/US08/63675, entitled METHODS AND SYSTEMS FOR MANAGING FACILITY POWER AND COOLING, filed on May 15, 2008, which is incorporated herein by reference in its entirety and is hereinafter referred to as PCT/US08/63675. In other embodiments, design interface 204 may be implemented with specialized facilities that enable user 202 to design, in a drag and drop fashion, a model that includes a representation of the physical layout of a data center or any subset thereof. This layout may include representations of data center structural components as well as data center equipment. The features of design interface 204, as may be found in various embodiments in accord with the present invention, are discussed further below.

As shown in FIG. 2, data center design and management system 206 presents data design interface 204 to user 202. According to one embodiment, data center design and management system 206 may include the data center design and management system as disclosed in PCT/US08/63675. In this embodiment, design interface 204 may incorporate functionality of the input module, the display module and the builder module included in PCT/US08/63675 and may use the database module to store and retrieve data.

As illustrated, data center design and management system 206 may exchange information with data center database 210 via network 208. This information may include any information required to support the features and functions of data center design and management system 206. For example, in one embodiment, data center database 210 may include at least some portion of the data stored in the data center equipment database described in PCT/US08/63675. In another embodiment, this information may include any information required to support design interface 204, such as, among other data, the physical layout of one or more data center model configurations, the production and distribution characteristics of the cooling providers included in the model configurations, the consumption characteristics of the cooling consumers in the model configurations and one or more cooling metrics characterizing the amount of cool air produced by the cooling providers that is lost prior to being consumed by the cooling consumers.

In at least one embodiment, data center database 210 may store, as part of the physical layout of a data center model configuration, the location and characteristics of the tiles that make up surfaces of the data center, such as the floor, ceiling and walls, of a model space. In at least one embodiment, the tiles may be floor tiles that are part of a raised floor, while in another embodiment the tiles may be ceiling tiles that are part of a drop ceiling. The characteristics of the tiles stored in data center database 210 may include, among other characteristics, whether or not the tiles are perforated, the size of the tiles and cooling metrics associated with the tiles, such as, in the example of a perforated tile, the airflow rate and temperature of air passing through it. As used herein, the term "perforated tile" may include any surface designed to allow airflow to pass through its boundry. Examples of perforated tiles include, among others standard-sized perforated tiles, custom-sized perforated tiles, cover grills and open holes. In some embodiments, this information is useful for providing enhanced functionality through design interface 204.

In another embodiment, data center database 210 may store, as a portion of the production and distribution characteristics of the cooling providers, the type of cooling provider, the amount of cool air provided by the cooling provider, and a temperature of cool air provided by the cooling provider. Thus, for example, data center database 210 includes record of a particular type of CRAC unit that is rated to deliver airflow at the rate of 5,600 cfm at a temperature of 68 degrees Fahrenheit. In addition, the data center database 210 may store one or more cooling metrics, such as an airflow leakage rate of an air plenum, such as a raised floor or a drop ceiling.

Data center database 210 may take the form of any logical construction capable of storing information on a computer readable medium including, among other structures, flat files, indexed files, hierarchical databases, relational databases or object oriented databases. The data may be modeled using unique and foreign key relationships and indexes. The unique and foreign key relationships and indexes may be established between the various fields and tables to ensure both data integrity and data interchange performance.

The computer systems shown in FIG. 2, which include data center design and management system 206, network 208 and data center equipment database 210, each may include one or more computer systems. As discussed above with regard to FIG. 1, computer systems may have one or more processors or controllers, memory and interface devices. The particular configuration of system 200 depicted in FIG. 2 is used for illustration purposes only and embodiments of the invention may be practiced in other contexts. Thus, the invention is not limited to a specific number of users or systems.

Design Interface Embodiments

According to various embodiments, design interface 204 may provide users with a high degree of flexibility regarding how and when they design data center cooling systems. In these embodiments, the user may design the entire cooling system in advance of the remainder of the data center configuration, may design the cooling system concurrently with other attributes of the data center or may design the cooling system after other parts of the data center design are complete. Thus, design interface 204 may be used to design new data centers or may be used to modify the designs of existing data centers. The formulation of useful systems and methods for conducting these design activities is impacted by the unique manner in which design interface 204 may be structured and organized. Conversely, the elements used and acts performed in these design activities impact the attributes and facilities of this embodiment of design interface 204.

Figure 3:
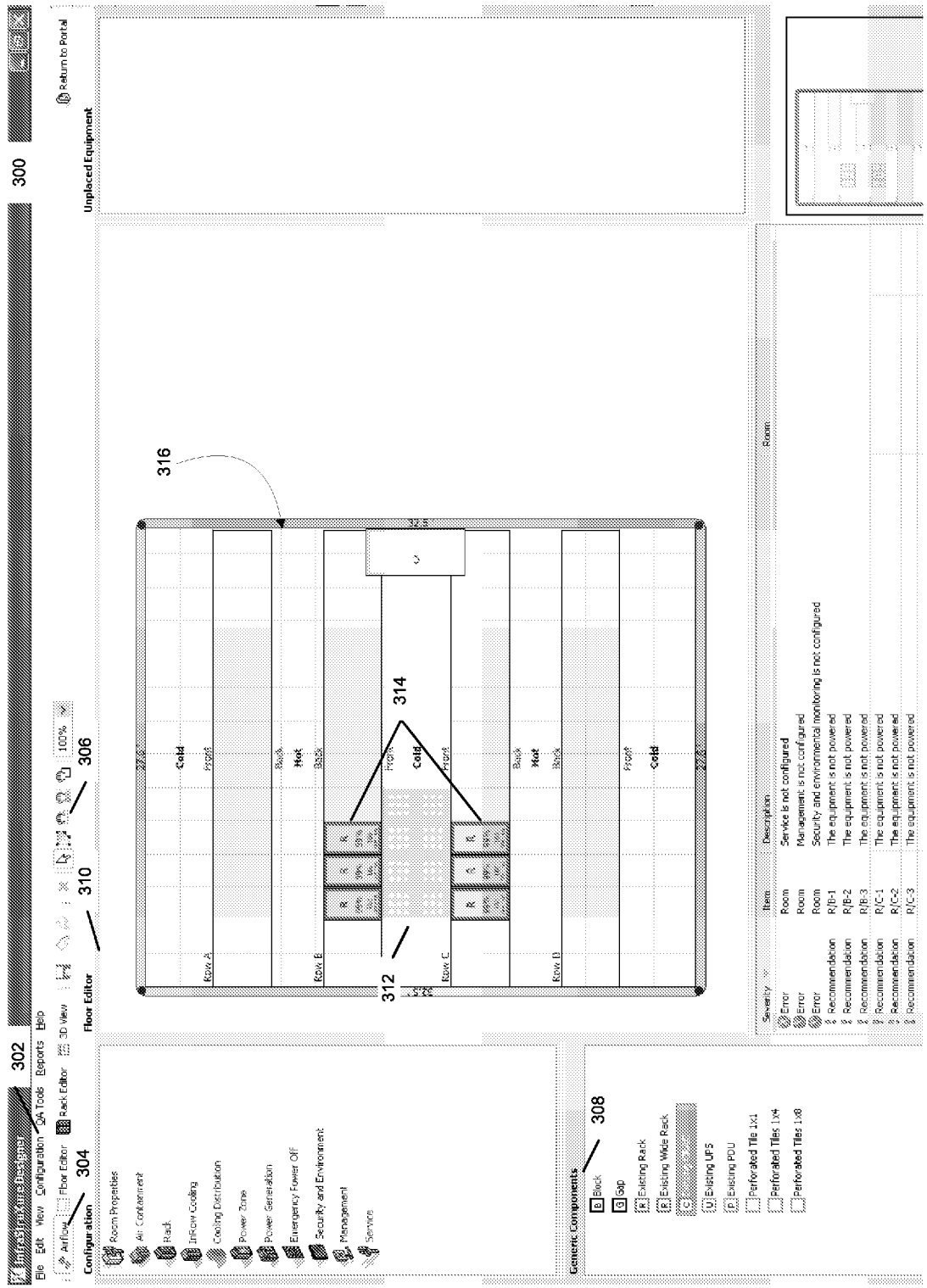
FIG. 3 depicts an example interface through which a user may design a data center model according to an embodiment.

Design interface 204 may provide functionality through a variety of user interface screens and elements. FIG. 3 illustrates an example of a user interface 300 that may be included in design interface 204 according to some embodiments. As shown, user interface 300 includes many of the user interface elements discussed in PCT/US08/63675 with regard to the floor editor and the rack editor. These elements may function within this embodiment as they function with the floor editor and the rack editor disclosed within PCT/US08/63675.

As shown in FIG. 3, user interface 300 includes menu 302, airflow toolbar element 304, grid toolbar element 306, generic components box 308, model space layout box 310, perforated floor tiles 312, racks 314 and grid 316. Model space layout box may include the functionality of the floor layout box described in PCT/US08/63675 along with additional functionality as described herein. Each of these user interface elements may include other interface elements.

In the illustrated embodiment, a user may cause user interface 300 to display the screen shown in FIG. 3 by actuating airflow toolbar element 304. In the depicted embodiment, the model space displayed in model space layout box 310 may be segmented into subunits to provide the user with greater flexibility in positioning equipment within the model. In various embodiments, these subunits may be any arbitrary grouping of components within the model. For example, in one embodiment, groups of components may be created based on equipment type, e.g. one group for power providing equipment, a second group of cooling providing equipment and a third group for power consuming equipment, etc. In another embodiment, one group may be created for perforated tiles and another for all other types of components. These groups may also be termed layers.

Other embodiments may employ layers of model components that share common location-based characteristics. For example, in one embodiment, components are grouped into layers based on their co-location with other components within a bounded area in the model space. These bounded areas may be formed in any size and shape. In one embodiment, these bounded areas are cuboids, often with heights that are relatively small when compared to their length and width.

In the illustrated embodiment, user interface 300 has two layers: one encompassing the perforated tiles in a raised floor, i.e. the floor layer, and another containing the components in the remainder of the model space, i.e. the ground layer. As shown, the layer encompassing the perforated tiles and the raised floor is represented by grid 316. Another embodiment may include three layers: one containing the raised floor, one containing a drop ceiling and one encompassing the model space in-between the other two layers. Other embodiments may have four or more layers representing various cross-sectional slices of the data center. For example, according to one embodiment the data center has one layer for each u-space of height between the raised floor and the drop ceiling.

Figure 7:
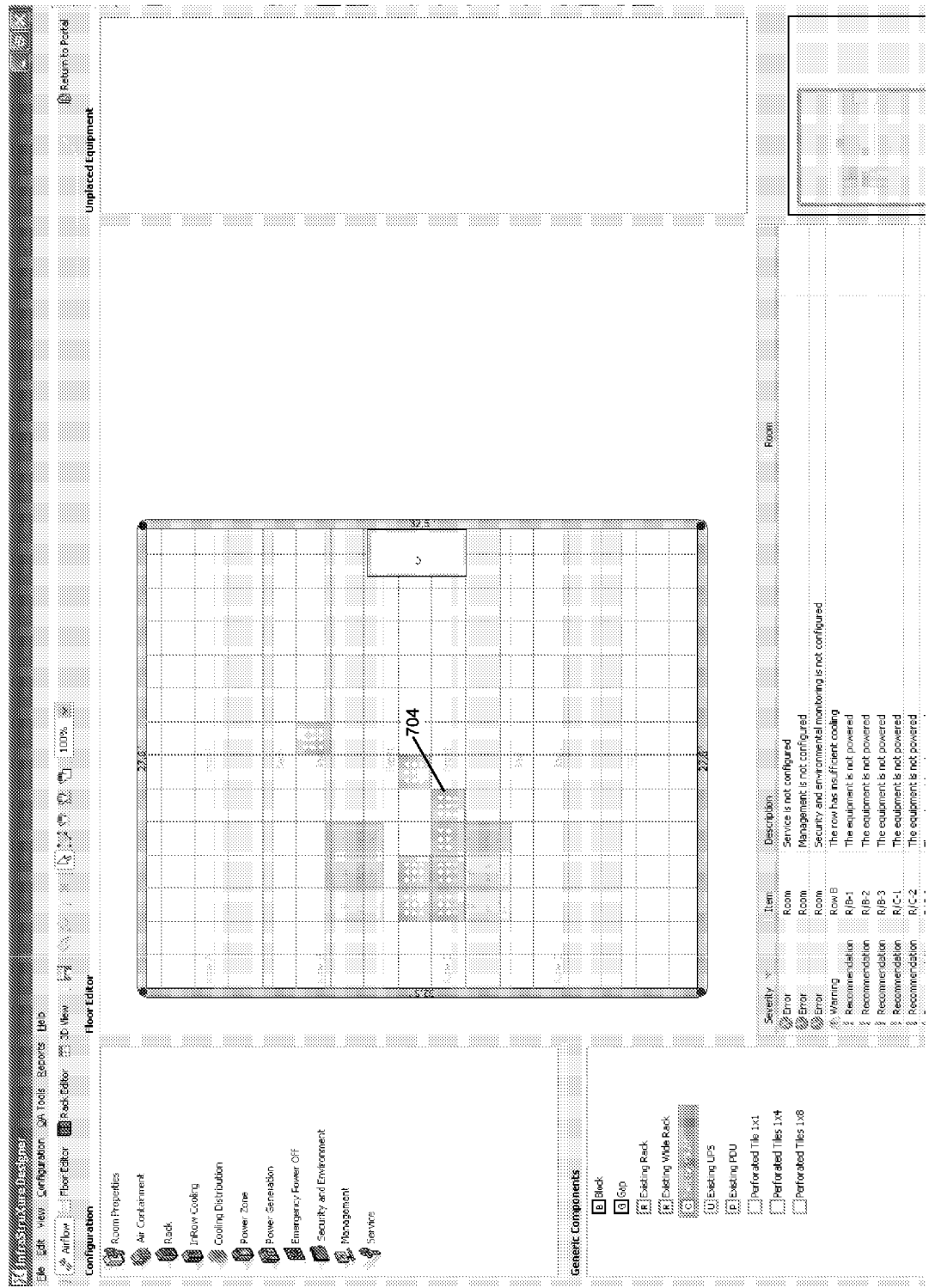
FIG. 7 depicts another example interface through which a user may design a data center model according to an embodiment.

With continued reference to the embodiment illustrated in FIG. 3, a user may select a specific layer for focus within model space layout box 310 via menu 302. In response, user interface 300 changes the layer currently in focus and may alter the appearance of model space layout box 310 in various fashions. For example, in one embodiment, user interface 300 may alter the size, shape or color of some or all of the representations that do not reside in the currently selected layer. In the depicted embodiment, user interface 300 may cause representations in layers that are not selected to become partially transparent. An example of this feature of user interface 300 is shown in FIGS. 4 and 7.

Figure 4:
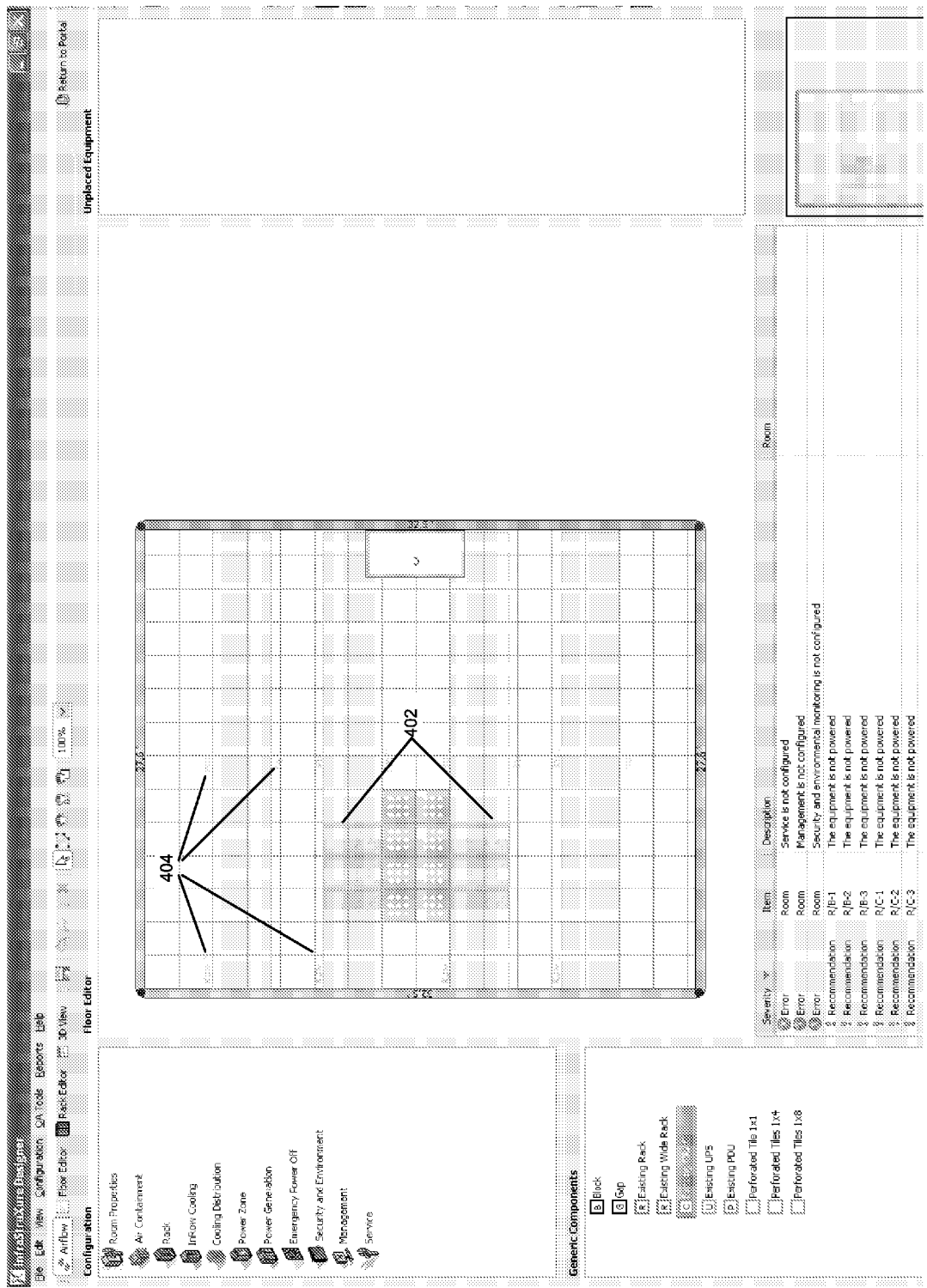
FIG. 4 shows another example interface through which a user may design a data center model according to an embodiment.

FIG. 4 depicts user interface 300 with the floor layer in focus. When the floor layer is in focus, user interface 300 displays racks 402 and row labels 404, which reside in the another layer, in a partially transparent form. In other embodiments, the degree of alteration of the representations may vary directly with the distance between the layer in which the representations reside and the selected layer. FIG. 7 also shows user interface 300 with the floor layer in focus. In FIG. 7, partially occluded tiles 704 are shown in the foreground with other components not in the floor layer shown in the background. Thus, embodiments of user interface 300 may allow for the efficient design of a three-dimensional model via a 2-dimensional interface, as layers add depth to the height and length of a conventional computer display.

Returning to the embodiment of FIG. 3, the user may position generic components, including one or more perforated tiles, within the model space represented in model space layout box 310 by dragging the desired component from generic components box 308 and dropping the component at a desired horizontal and vertical location within the model space layout box 310. According to one embodiment, generic components will be positioned within the currently selected layer in the horizontal and vertical location where the component is dropped.

In other embodiments, particular generic components may have default layers into which the components are normally placed. In these embodiments, user interface 300 may take a variety of actions when the default layer is not the layer into which the user attempts to position the component. For example, embodiments may refuse to position the component, may prompt the user for express instructions to position the component in the currently selected, non-default layer (or some other layer) or may simply position the component in its default layer without further interaction from the user.

In the embodiment illustrated in FIG. 3, a user may position a perforated tile on the floor layer by simply dragging and dropping the tile at a desired horizontal and vertical location within model space layout box 310. In response, user interface 300 will position the perforated tile in the floor layer at the selected horizontal and vertical location, regardless of whether the floor layer is the currently selected layer. In an embodiment which includes a ceiling layer, user interface 300 may respond to any ambiguity as to the target layer for a perforated tile by prompting the user to select the floor layer or the ceiling layer.

With continued reference to FIG. 3, user interface 300 provides the users with the ability to reposition one or more components within model space layout box 310. In one embodiment, the user may adjust the position of a component by dragging it from its current location and dropping it in its new location. In another embodiment the user may move a multiple components by selecting all of them and dragging and dropping them as a group. Other embodiments may allow a user to position and reposition tiles via other interfaces devices, such as a keyboard. Thus, embodiments are not limited to a particular interface device or method of indicating design preferences.

In the embodiment shown in FIG. 3, a user may move some or all of the components within one layer as a group relative to the components in other layers. Various embodiments may provide this functionality to a user using a variety of user interface elements. For example, in one embodiment, user interface 300 may provide a handle element for each layer which may be selected and dragged to move components within the selected layer relative to other layers. In another embodiment, user interface 300 may move components within a layer that is not in focus in response to a user selecting and dragging a component within that layer. In the embodiment depicted in FIG. 3, a user may move floor tiles within the floor tile layer by actuating grid toolbar element 306, followed by dragging and dropping the layer. A comparison between FIGS. 5 and 6 demonstrates this feature.

Figure 5:
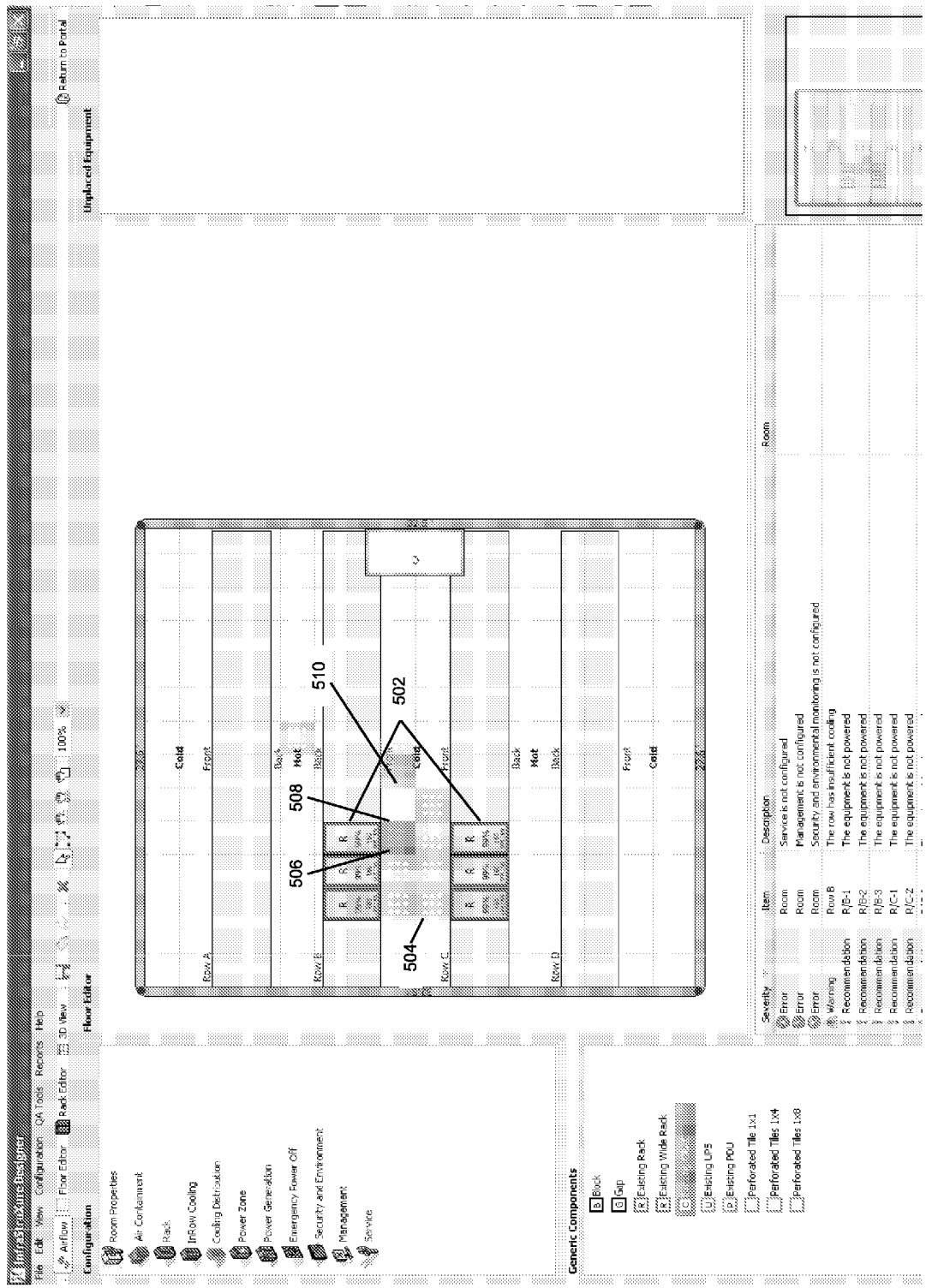
FIG. 5 illustrates another example interface through which a user may design a data center model according to an embodiment.
Figure 6:
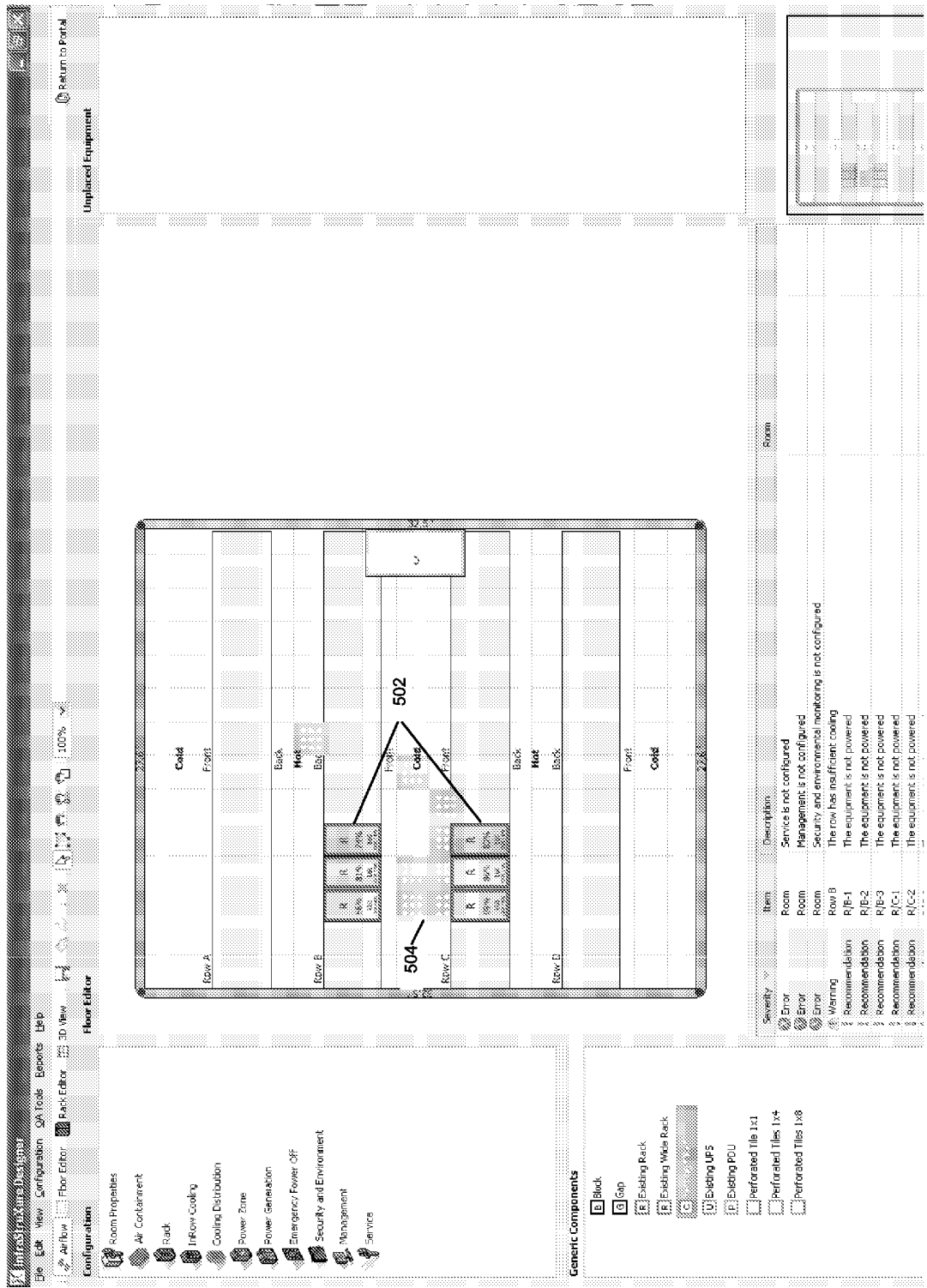
FIG. 6 shows another example interface through which a user may design a data center model according to an embodiment.

FIG. 5 includes racks 502 and perforated tiles 504. FIG. 6 also includes racks 502 and perforated tiles 504. FIG. 5 illustrates the relative positions of the racks and perforated tiles before the floor layer is moved and FIG. 6 illustrates the relative positions of the racks and the perforated tiles after the floor layer is moved. As can be seen, the grid of perforated tiles in FIG. 6 has been moved down by one quarter of a tile length, or six inches (in this embodiment). As a result, perforated floor tiles 504 have become partially occluded by some of the racks 502.

In some embodiments, the modeled data center configuration may include groups of data center equipment and the cooling components needed to support their operation. Once these groups are defined, user interface 300 may enable a user to move the entire group from one location to another within model space layout box 310. According to one embodiment, movement of a group may be accomplished by selecting a group prior to dragging the group from its current location and dropping the group at is new location.

With reference to FIG. 3, the system also determines cooling metrics and user interface 300 indicates these metrics via the components included in model space layout box 310. Various embodiments may determine these cooling metrics in a variety of ways. For example, in one embodiment, user interface 300 determines cooling metrics by calculating them using the design characteristics of the model. PCT/US08/63675 discusses a variety of methods that may be used to determine if the airflow to data center equipment is sufficient and describes a variety of metrics that may be calculated. In other embodiments, calculated metrics may be supplemented or replaced by measured values or values input by an external entity, such as a user or other computer system.

Figure 8:
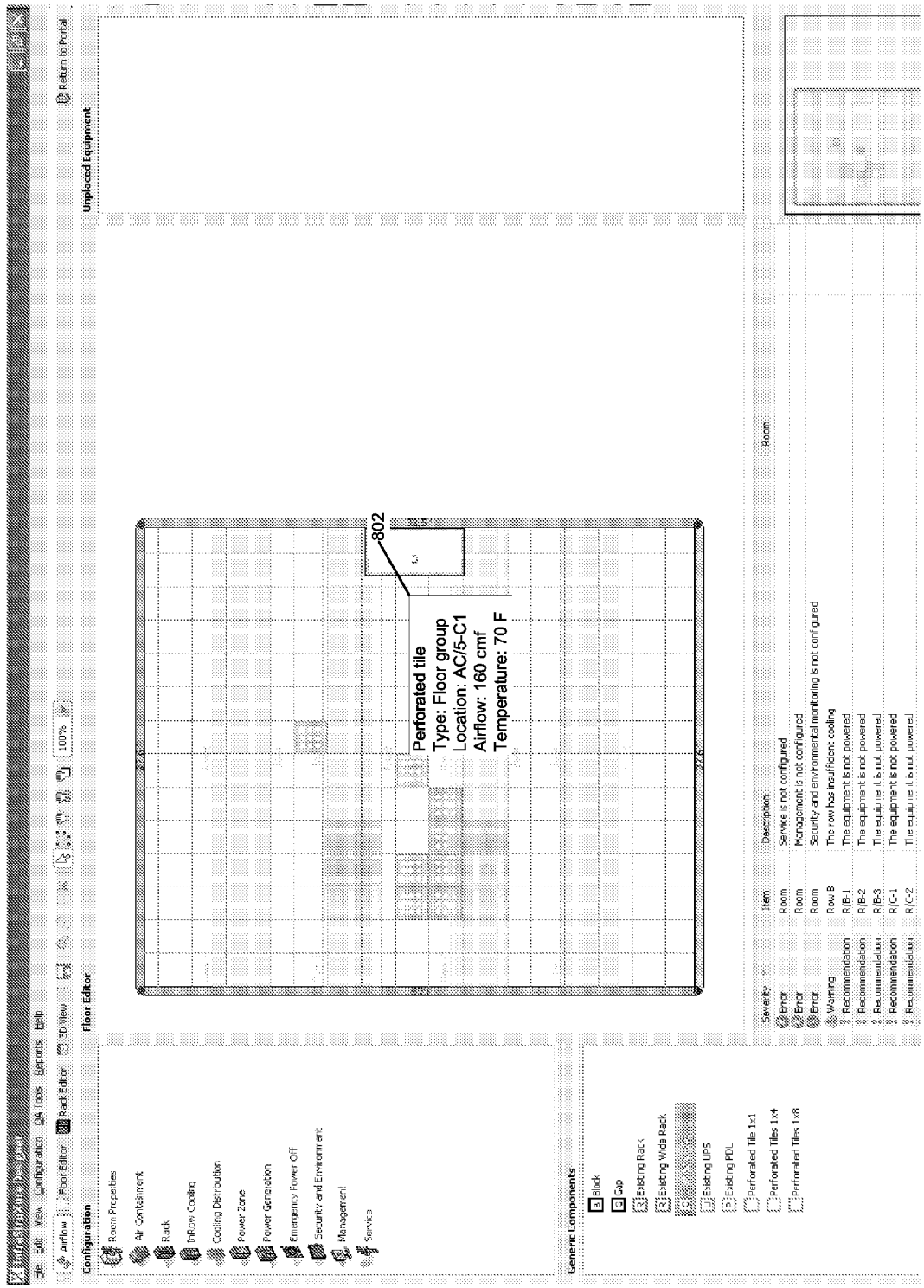
FIG. 8 shows another example interface through which a user may design a data center model according to an embodiment.

For example, FIG. 8 illustrates an embodiment including user interface 300 in which a user may access cooling metrics associated with components. As shown, user interface 300 provides a context menu 802. The contents of context menu 802 may vary based on the component for which it is displayed. According to one embodiment, the context menu may display, among other elements, the component type, the layer in which the component resides, the location of the component, and cooling metrics associated with the component. In the illustrated embodiment, the component is a perforated tile residing in the floor layer at location AC/5-C1 and the cooling metrics associated with the tile are its airflow rate (160 cfm) and temperature of the airflow (70 degrees Fahrenheit).

According to an embodiment, user interface 300 may present context menu 802 when requested by the user. For example, user interface 300 may present context menu 802 in response to a right-click from a mouse. In another embodiment, user interface 300 may display context menu 802 in response to a cursor hovering over a component beyond a threshold period of time.

According to another embodiment, user interface 300 may allow the user to adjust cooling metrics associated with components. For example, a user may enter a new airflow rate or temperature reading into context menu 802. User interface 300 may take further action in response, based on the values entered by the user. For example, user interface 300 may calculate that, based on the new values, the airflow rate is insufficient to meet the requirements of one or more components. In this case, user interface 300 may notify the user by altering the appearance of one or more components, as is discussed further below.

In the embodiment illustrated in FIG. 3, a user interface 300 may calculate a particular cooling metric, the rate of airflow passing through perforated tiles, using equation 1.

$$T = \frac{C*(1-L)}{N} \quad (1)$$

In equation 1, T is the per tile airflow rate, C is the room based CRAC airflow rate, L is the percentage of the CRAC airflow that leaks from the room and N is the number of perforated tiles in the room. In a case where no perforated tiles are present in the room, i.e. N=0, the airflow rate, T, is 0. According to one embodiment, the airflow rate of each perforated tile in the model space is assigned the value T. Thus, according to this embodiment, all perforated tiles are calculated to have a uniform airflow rate. As discussed above with regard to FIG. 8, a user may modify this uniform airflow rate on a tile by tile basis by entering airflow values through user interface 300. In one embodiment, modeled perforated tiles may be partially or completely occluded by other components, for example a portion of a rack may be placed upon a portion of a perforated tile or a portion of a perforated tile may be placed under a rack. In these instances, user interface 300 may determine the rate of airflow passing through the perforated tile using a proportion of the exposed tile surface to the total tile surface.

One embodiment manifests recognition that standardized sizing of many types of data center equipment enables a model to accurately account for floor surface consumption using six-inch increments, which is a quarter or 25% of the length of a standard floor tile. In this embodiment, perforated tiles may be occluded in increments of one quarter of their surface area, which simplifies the calculations required to determine the airflow passing through a partially occluded model tile.

In various embodiments, user interface 300 may indicate that placement of components complies or does non-comply with one or more data center design policies, i.e. policies that specific redundancy, runtime or other requirements that a data center design may satisfy. For example, in a data center model implementing hot and cold aisles, user interface 300 may indicate that perforated tiles should not be placed in hot aisles. In one embodiment, this indication may take the form of presenting the representation of the tile in a specified color, for example, red indicating non-compliance and green indicating compliance.

For example, in various embodiments, user interface 300 may indicate one or more cooling metrics within each component displayed in model space layout box 310. For example, in one embodiment, user interface 300 may alter the appearance of a rack based on the modeled airflow associated with tiles near, for example, adjacent to, the location of the rack. In another example, user interface 300 may change the color of one or more perforated tiles based on one or more threshold airflow rate values. In the specific configuration shown in FIG. 3, racks 318 illustrate multiple indications, such as their coloring and capture index percentage, that show the racks are receiving sufficient cool air. Capture indices and other cooling metrics may be more fully understood with reference to U.S. patent application Ser. No. 12/019,109, entitled SYSTEM AND METHOD FOR EVALUATING EQUIPMENT RACK COOLING PERFORMANCE, filed on Jan. 24, 2008, which is incorporated herein by reference in its entirety.

In other embodiments, user interface 300 may repeatedly determine cooling metrics and display associated indicators while components are being moved by a user, thus providing the user with rapid and iterative feedback regarding potential changes to the data center configuration. FIG. 5 illustrates this feature. In FIG. 5, perforated tile 506 is in the process of being moved from its previous location 508 to a proposed location 510. User interface 300 determines the airflow characteristics for the proposed data center configuration, while the move is being performed, and displays an indicator of those metrics. For example, in one embodiment, the color of proposed location 510 may be green to indicate the calculated airflow metrics show sufficient airflow will exist if the tile is moved to proposed location 510. In another embodiment, the color of cooling consumers, such as racks, may be altered to provide the user with feedback regarding the cooling performance associated with moving a tile to a proposed location.

As discussed above, user interface 300 may provide feedback regarding compliance with a variety of data center design policies. Thus the basis of this iterative feedback is not limited to cooling metrics. For example, in other embodiments, user interface 300 may provide iterative feedback based on a proposed tile location being compliant or non-compliant with a hot aisle/cold aisle policy. Other embodiments may provide iterative feedback based on compliance with one or more supply policies associated with any data center resource.

According to other embodiments, design interface 204 may exchange information with various providers and consumers. These providers and consumers may include any external entity including, among other entities, users and systems. In the exemplary embodiment illustrated in FIG. 3, users exchange information with design interface 204. In an alternative embodiment, this information may be exchanged with other applications or storage media using system interfaces exposed design interface 204. Embodiments of design interface 204 may both restrict input to a predefined set of values and validate any information entered prior to using the information or providing the information to other system elements. Additionally, design interface 204 may validate the identity of an external entity prior to, or during, interaction with the external entity. These functions may prevent the introduction of erroneous data into the system or unauthorized access to the system.

Design Processes

Figure 9:
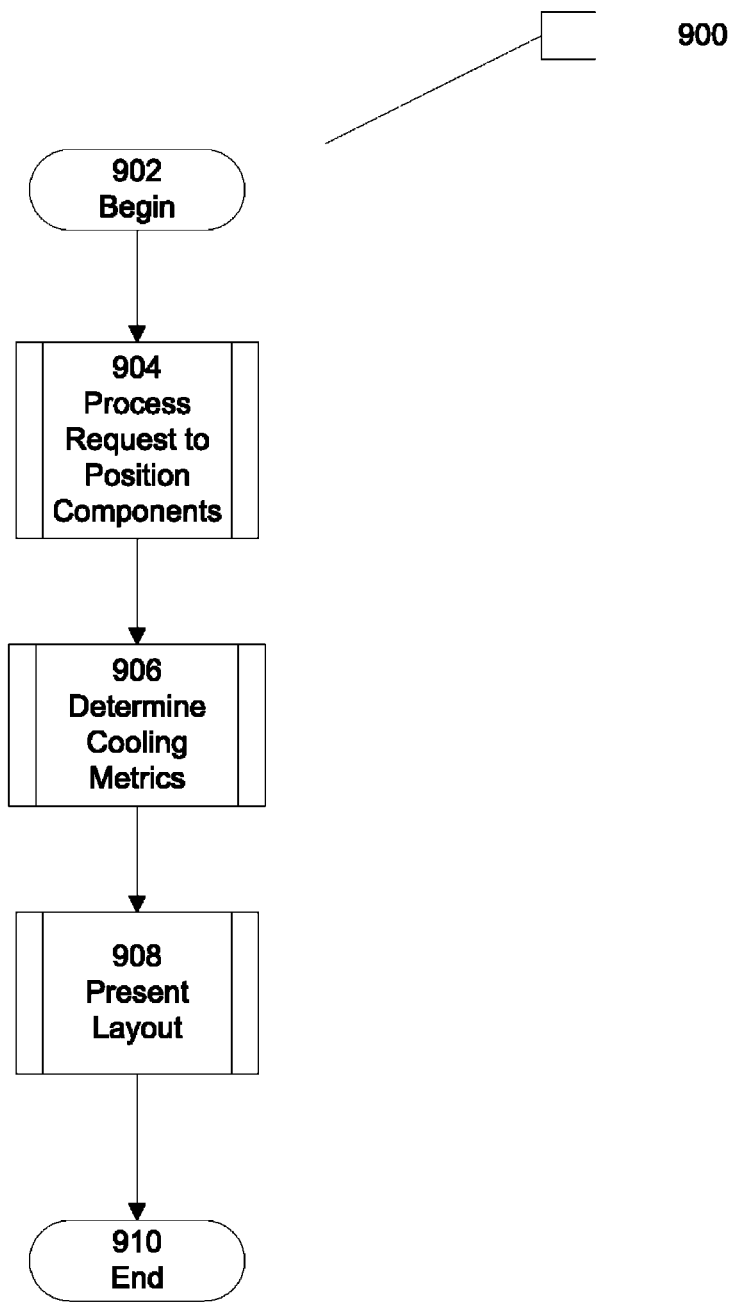
FIG. 9 illustrates an example process for designing a data center configuration according to an embodiment.

Various embodiments provide processes for designing the layout of a data center. FIG. 9 illustrates one such process 900 that includes acts of processing a request to position components, determining cooling metrics and presenting a model layout. Process 900 begins at 902.

In act 904, a request to position components is processed. According to various embodiments, this request may indicate one or more components that are requested to be located at one or more positions in a model space. Acts in accord with these embodiments are discussed below with reference to FIG. 10.

In act 906, cooling metrics are determined. According to some embodiments, cooling metrics may be determined for various components included in a model space. Acts in accord with these embodiments are discussed below with reference to FIG. 11.

In act 908, model space layouts are presented. According to other embodiments, model space layouts including components and indications of cooling metrics are presented. Acts in accord with these embodiments are discussed below with reference to FIG. 12.

Process 900 ends at 910. Design activities in accord with process 900 may continue for an indefinite period of time and may be highly iterative in nature. These traits enable systems engaged in process 900 to develop data center configurations that are tailored to meet a variety of design objectives.

Figure 10:
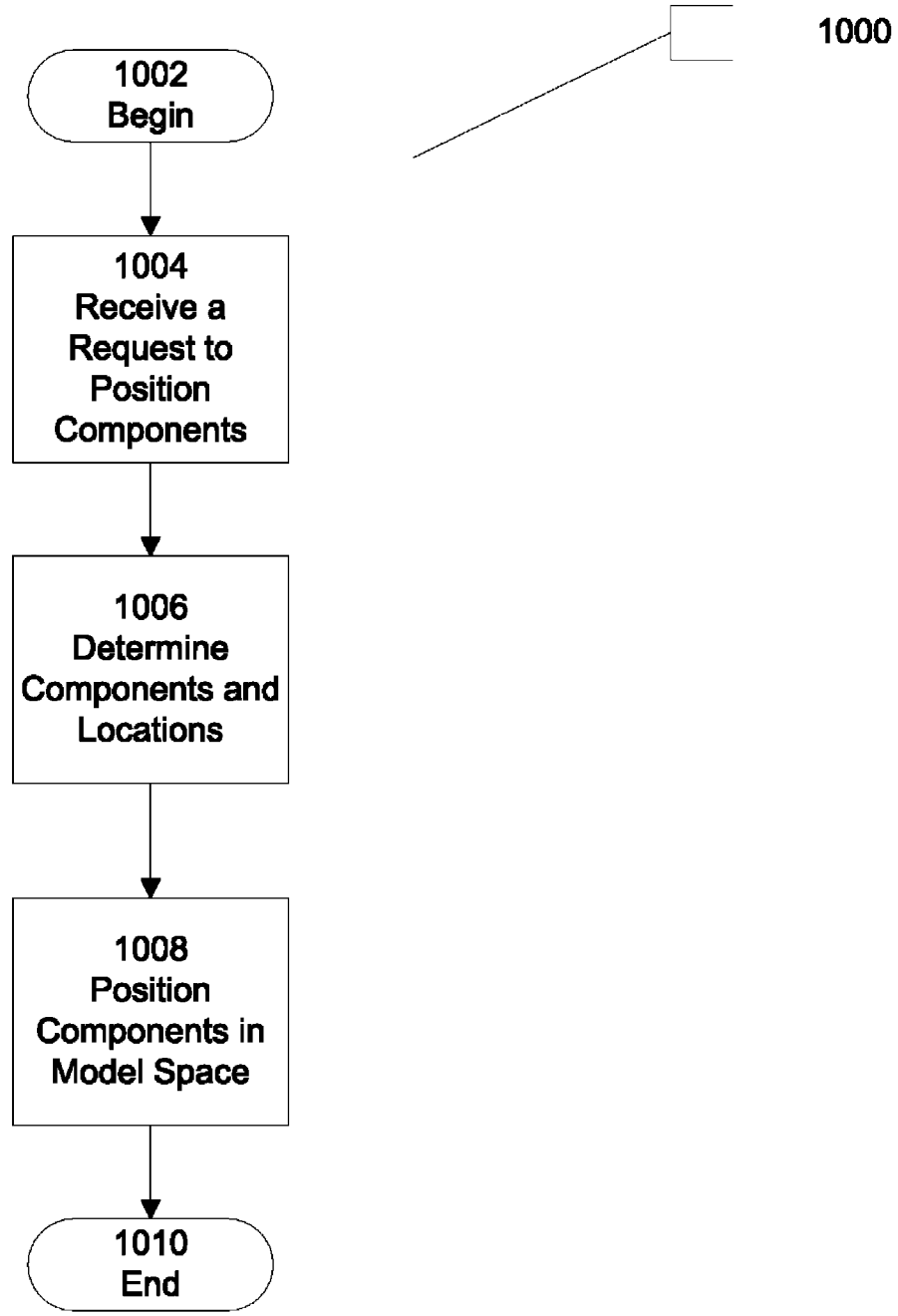
FIG. 10 depicts another example process for designing a data center configuration according to an embodiment.

Various embodiments provide processes for processing requests to position components. FIG. 10 illustrates one such process 1000 that includes acts of receiving a request to position components, determining components and location, and positioning the components in a model space. Process 1000 begins at 1002.

In act 1004, a request to position components is received. The request may include an indication of one or more components to be positioned and one or more target locations within a model space. In one embodiment, the request may be caused by an act of dragging and dropping a component at a location within the model space as discussed above with regard to user interface 300. In another embodiment, the request may be caused by an act of dragging and dropping a group of components or an act of dragging and dropping a layer defined in the model space. In another embodiment, design interface 204 may receive the request via an interface device other than a mouse, such as, for example, a keyboard.

In act 1006, the components and target locations are determined. These components may already be present in the model space or may be components to add to, or remove from, the model space. In one embodiment, the request may include a single component, multiple components, a group of components or a layer of components defined within the model space. In at least one embodiment, the component requested is a perforated tile. In another embodiment, the component requested is a floor layer of perforated tiles. In still another embodiment, the component requested is a ceiling layer of perforated tiles.

According to another embodiment, the request may also include one or more target locations within the model space. According to various embodiments, the locations within the request may also include a target layer. In some of these embodiments, the target layer may be a ceiling layer or a floor layer.

In act 1008, components are positioned in the model space. According to an embodiment, this act may include determining into which layer a component should be placed, i.e. the current layer or a default layer, as discussed above with regard to user interface 300. According to one embodiment, once an actual destination location within the modal space is determined, the data center model configuration may be updated in data center database 210.

Process 1000 ends at 1010.

Figure 11:
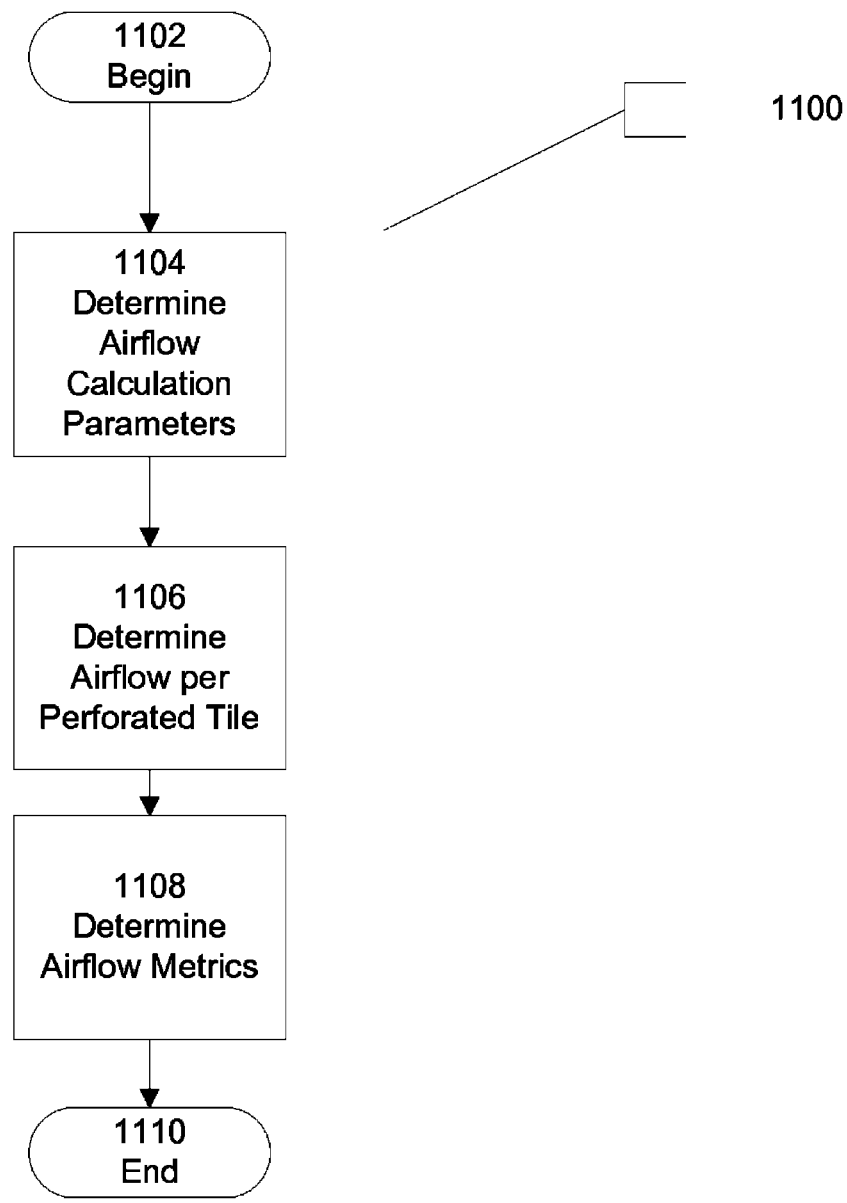
FIG. 11 shows another example process for designing a data center configuration according to an embodiment.

Various embodiments provide processes for determining cooling metrics. In one embodiment the cooling metrics determined include airflow metrics. FIG. 11 illustrates one such process 1100 that includes acts of determining airflow calculation parameters, determining airflow per perforated tile and determining airflow metrics. Process 1100 begins at 1102.

In act 1104, airflow calculation parameters are determined. In one embodiment, these parameters are the variables needed to perform the calculation shown in equation 1 discussed above, i.e. the room based CRAC airflow rate, the percentage of the CRAC airflow that leaks from the room and the number of perforated tiles in the room. These variables may be determined using a variety of techniques. For example, in one embodiment, these variables may be stored in memory, or a local file, when entered by a user and may later be retrieved for use in this calculation. In another embodiment, these parameters may be determined by querying data center database 210. For example, in one embodiment, the airflow of the CRAC unit may be determined by retrieving benchmark values for the CRAC unit from data center database 210. Benchmark values may specify various operational characteristics of data center equipment and are more fully discussed in PCT/US08/63675. In another embodiment, the airflow of the CRAC and the leakage rate may be determined by queuing for user-entered value in data center database 210. According to another embodiment, the number of perforated tiles may be determined with reference to the current number of perforated tiles included in the model space, which is stored in data center database 210.

In act 1106, the airflow rate per tile is determined. According to one embodiment, this value is calculated using equation 1 and the values gathered in act 1104. In this embodiment, the airflow associated with partially or fully occluded airflow tiles may be adjusted, in increments of 25%, based on the amount of surface area occlusion. In another embodiment, the airflow per tile, for at least some portion of the tiles, may be retrieved from user-entered data included in data center database 210.

In act 1108, airflow metrics are determined. In one embodiment, these airflow metrics may include a capture index or some other metric that characterizes the ability of the airflow to meet the requirements of cooling consumers.

Process 1100 ends at 1110.

Figure 12:
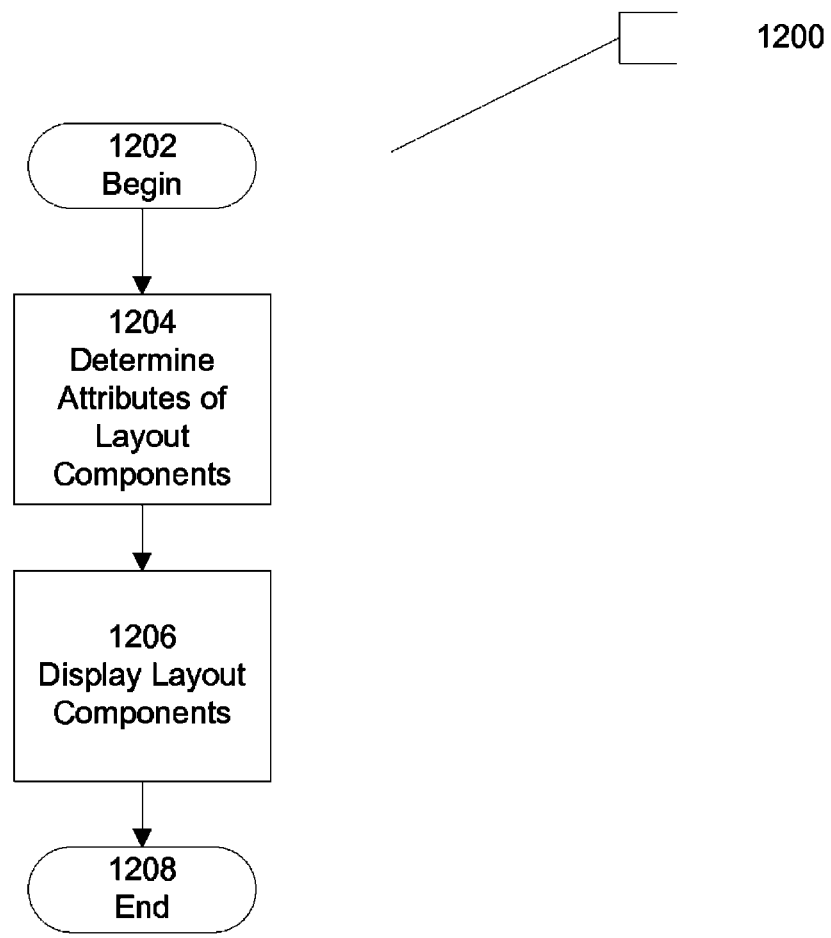
FIG. 12 illustrates another example process for designing a data center configuration according to an embodiment.

Various embodiments provide processes for presenting a model space layout. FIG. 12 illustrates one such process 1200 that includes acts of determining attributes of layout components and displaying layout components. Process 1200 begins at 1202.

In act 1204, the attributes of the layout are determined. These attributes may include, among other information, the layer currently in focus, the current location of the components included in the model space, any current or target locations within the model space for components that are being moved and any structural representations, such as wall, doors, etc. . . . that are included in the model space.

In act 1206, layout components are displayed. According to one embodiment, the model space layout and its constituent components may be presented in the display of a computer system. According to this embodiment the model space layout may be displayed using user interface 300, as discussed above. Thus, components may be displayed with a variety of appearance alterations that indicate various information, including layer position and cooling supply sufficiency.

Process 1200 ends at 1208.

Each of process 900, 1000, 1100 and 1200 depicts one particular sequence of acts in a particular embodiment. The acts included in each of these processes may be performed by, or using, one or more computer systems specially configured as discussed herein. Thus the acts may be conducted by external entities, such as users or separate computer systems, by internal elements of a system or by a combination of internal elements and external entities. Some acts are optional and, as such, may be omitted in accord with one or more embodiments. Additionally, the order of acts can be altered, or other acts can be added, without departing from the scope of the present invention. In at least some embodiments, the acts have direct, tangible and useful effects on one or more computer systems, such as storing data in a database or providing information to external entities.

Any references to front and back, left and right, top and bottom, and upper and lower are intended for convenience of description, not to limit the present systems and methods or their components to any one positional or spatial orientation.

Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements.

Any embodiment disclosed herein may be combined with any other embodiment, and references to "an embodiment," "some embodiments," "an alternate embodiment," "various embodiments," "one embodiment," "at least one embodiment," "this and other embodiments" or the like are not necessarily mutually exclusive and are intended to indicate that a particular feature, structure, or characteristic described in connection with the embodiment may be included in at least one embodiment. Such terms as used herein are not necessarily all referring to the same embodiment. Any embodiment may be combined with any other embodiment in any manner consistent with the aspects disclosed herein. References to "or" may be construed as inclusive so that any terms described using "or" may indicate any of a single, more than one, and all of the described terms.

Where technical features in the drawings, detailed description or any claim are followed by references signs, the reference signs have been included for the sole purpose of increasing the intelligibility of the drawings, detailed description, and claims. Accordingly, neither the reference signs nor their absence have any limiting effect on the scope of any claim elements.

Having now described some illustrative aspects of the invention, it should be apparent to those skilled in the art that the foregoing is merely illustrative and not limiting, having been presented by way of example only. Similarly, aspects of the present invention may be used to achieve other objectives including allowing users to design facilities other than data centers which may benefit from effective and efficient cooling systems. For example, according to one embodiment, users may design indoor recreational facilities, such as an indoor track, rock climbing facility or theatrical entertainment facility, which may include perforated tiles on the floor, ceiling and walls for a variety of uses. Numerous modifications and other illustrative embodiments are within the scope of one of ordinary skill in the art and are contemplated as falling within the scope of the invention. In particular, although many of the examples presented herein involve specific combinations of method acts or system elements, it should be understood that those acts and those elements may be combined in other ways to accomplish the same objectives.

What is claimed is:

1. A method for presenting a cooling model of a data center, the cooling model including representations of at least one cooling provider, at least one cooling consumer and at least one perforated tile, the at least one cooling consumer having cooling requirements, the method comprising:
   segmenting the cooling model into a plurality of layers, each of the plurality of layers being a bounded space within the cooling model and including one or more modeled components located within the bounded space, the plurality of layers having a first layer that includes the at least one perforated tile and a second layer that includes the at least one cooling consumer;
   receiving an indication to reposition the first layer relative to the second layer;
   determining, in response to the indication and based upon positions of the first layer and the second layer, at least one new position for the at least one perforated tile relative to the at least one cooling consumer;
   determining a cooling metric measuring the ability of the at least one cooling provider to meet the cooling requirements of the at least one cooling consumer via the at least one perforated tile in the at least one new position; and
   displaying the cooling model on a computer system, the at least one cooling consumer including an indication of the cooling metric.

2. The method according to claim 1, wherein receiving an indication includes receiving the indication responsive to a user dragging and dropping the first layer relative to the second layer.

3. The method according to claim 1, wherein determining the at least one new position includes determining at least one new position where a percentage of the surface area of the at least one perforated tile is occluded.

4. The method according to claim 3, wherein determining the cooling metric includes determining a rate of airflow, and the method further comprises calculating a rate of airflow associated with the at least one perforated tile in the at least one new position as a function of the occluded percentage of the surface area of the at least one perforated tile in the at least one new position.

5. The method according to claim 4, wherein calculating the rate of airflow includes calculating the rate of airflow as a function of the occluded percentage, the occluded percentage being valued in 25% increments.

6. The method according to claim 1, wherein determining the cooling metric includes retrieving a user defined rate of airflow associated with the at least one perforated tile.

7. The method according to claim 1, wherein determining the cooling metric includes determining a uniform rate of airflow.

8. The method according to claim 7, wherein determining the uniform rate of airflow includes calculating the uniform rate of airflow associated with the at least one perforated tile as a function of an airflow rate of the cooling provider, a rate of leakage of airflow and a number of perforated tiles supplied by the cooling provider, the number of perforated tiles including the at least one perforated tile.

9. The method according to claim 1, wherein displaying the cooling model on the computer system includes displaying a representation of a rack, the representation indicating a rate of airflow in a model space adjacent to the rack.

10. The method according to claim 1, wherein displaying the cooling model on the computer system includes displaying the at least one new position including an indication of the cooling metric.

11. The method according to claim 1, further comprising repositioning the at least one perforated tile to the at least one new position.

12. A system for presenting a cooling model of a data center, the system comprising:
an interface; and
a controller configured to:
segment the cooling model into a plurality of layers, each of the plurality of layers being a bounded space within the cooling model and including one or more modeled components located within the bounded space, the plurality of layers including:
a first layer having at least one perforated tile; and
a second layer having at least one cooling consumer;
receive an indication to reposition the first layer relative to the second layer;
determine, in response to the indication and based upon positions of the first layer and the second layer, at least one new position for the at least one perforated tile relative to the at least one cooling consumer;
determine a cooling metric measuring the ability of the at least one cooling provider to meet the cooling requirements of the at least one cooling consumer via the at least one perforated tile in the at least one new position; and
display the cooling model on a computer system, the at least one cooling consumer including an indication of the cooling metric.

13. The system according to claim 12, wherein the controller is further configured to receive the indication responsive to a user dragging and dropping the first layer relative to the second layer.

14. The system according to claim 12, wherein the controller is further configured to determine the cooling metric at least in part by retrieving a user defined rate of airflow associated with the at least one perforated tile.

15. The system according to claim 12, wherein the controller is further configured to determine the cooling metric at least in part by determining a uniform rate of airflow.

16. The system according to claim 15, wherein the controller is further configured to determine the uniform rate of airflow at least in part by calculating the uniform rate of airflow associated with the at least one perforated tile as a function of an airflow rate of the cooling provider, a rate of leakage of airflow and a number of perforated tiles supplied by the cooling provider, the number of perforated tiles including the at least one perforated tile.

17. The system according to claim 12, wherein the controller is further configured to display the cooling model on the computer system at least in part by displaying a representation of a rack, the representation indicating a rate of airflow in a model space adjacent to the rack.

18. The system according to claim 12, wherein the controller is further configured to display the cooling model on the computer system at least in part by displaying the at least one new position including an indication of the cooling metric.

19. The system according to claim 12, wherein the controller is further configured to reposition the at least one perforated tile to the at least one new position.

20. A non-transitory computer readable medium having stored thereon sequences of instructions for presenting a cooling model of a data center, the cooling model including representations of at least one cooling provider, at least one cooling consumer and at least one perforated tile, the at least one cooling consumer having cooling requirements, the cooling model having a plurality of layers, each of the plurality of layers being a bounded space within the cooling model and including one or more modeled components located within the bounded space, the sequences of instructions including instructions that instruct at least one processor to:
receive an indication to position a first layer of the plurality of layers relative to a second layer of the plurality of layers, the first layer including the at least one perforated tile, the second layer including the at least one cooling consumer;
determine, in response to the indication and based upon positions of the first layer and the second layer, at least one new position for the at least one perforated tile relative to the at least one cooling consumer;
calculate cool air available in a model space adjacent to the at least one perforated tile, the act of calculating the cool air including calculating an airflow to the model space adjacent to the at least one perforated tile as a function of an airflow rate of the cooling provider, a rate of leakage of airflow and a number of perforated tiles supplied by the cooling provider; and
display the model on a computer system, the model having a plurality of layers, each of the plurality of layers being a bounded space within the model and including one or more modeled components located within the bounded space, the plurality of layers having a first layer that includes the at least one perforated tile and a second layer that includes the at least one cooling consumer and an indication of the available cool air.

21. The computer readable medium according to claim 20, wherein the instructions will further cause a processor to receive the indication responsive to a user dragging and dropping the first layer relative to the second layer.

22. The computer readable medium according to claim 20, wherein the instructions will further cause a processor to retrieve a user defined rate of airflow associated with at least one other perforated tile.

23. The computer readable medium according to claim 22, wherein the instructions will further cause a processor to display an indication of cool air available in a model space adjacent the at least one other perforated tile using the user defined rate of airflow.

* * * * *